(12) United States Patent
Groen et al.

(10) Patent No.: US 6,870,390 B1
(45) Date of Patent: Mar. 22, 2005

(54) TX LINE DRIVER WITH COMMON MODE IDLE STATE AND SELECTABLE SLEW RATES

(75) Inventors: Eric D. Groen, Ankeny, IA (US); Charles W. Boecker, Ames, IA (US); William C. Black, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 39 days.

(21) Appl. No.: 10/660,448

(22) Filed: Sep. 11, 2003

(51) Int. Cl.[7] .......................................... H03K 19/003
(52) U.S. Cl. ..................... 326/27; 326/115; 326/127; 326/21; 326/26; 327/108; 327/170
(58) Field of Search ...................... 326/21, 26, 27, 326/86, 115, 121, 126, 127; 329/108–109, 170

(56) References Cited

U.S. PATENT DOCUMENTS

| | | | | |
|---|---|---|---|---|
| 5,959,492 A | * | 9/1999 | Khoury et al. | 327/389 |
| 5,999,044 A | * | 12/1999 | Wohlfarth et al. | 327/563 |
| 6,229,336 B1 | * | 5/2001 | Felton et al. | 326/38 |
| 6,353,338 B1 | * | 3/2002 | Fiedler et al. | 326/83 |
| 6,366,140 B1 | * | 4/2002 | Warwar | 327/108 |
| 6,411,126 B1 | * | 6/2002 | Tinsley et al. | 326/83 |
| 6,437,599 B1 | * | 8/2002 | Groen | 326/63 |
| 6,762,625 B1 | * | 7/2004 | Devnath | 326/115 |

OTHER PUBLICATIONS

U.S. Appl. No. 10/659,803, filed Sep. 11, 2003, Black et al.
U.S. Appl. No. 10/659,971, filed Sep. 11, 2003, Boecker et al.
U.S. Appl. No. 10/660,062, filed Sep. 11, 2003, Groen et al.

* cited by examiner

*Primary Examiner*—Vibol Tan
(74) *Attorney, Agent, or Firm*—James Harrison

(57) ABSTRACT

A transmit line driver with selectable slew rates and a common mode idle state comprises a capacitor array of selectable capacitors coupled between a line driver and a pre-driver wherein a slew rate may be selected by the selectable capacitors. A common mode idle state is provided by coupling a selectable switch (MOSFET in the described embodiment) to a mirror device that provides a bias current to the pre-driver wherein, when the bias current is removed by the switch, the pre-driver produces an output signal that is equal to the supply voltage for the circuit. Accordingly, a differential pair of the line driver are both biased on and provide a common mode idle state. The common mode idle state is equal to one half of an output signal magnitude for a logic one.

29 Claims, 10 Drawing Sheets programmable multi-gigabit transceivers 14 - 28 programmable multi-gigabit transceivers 14 - 28 programmable receive PMA module 40

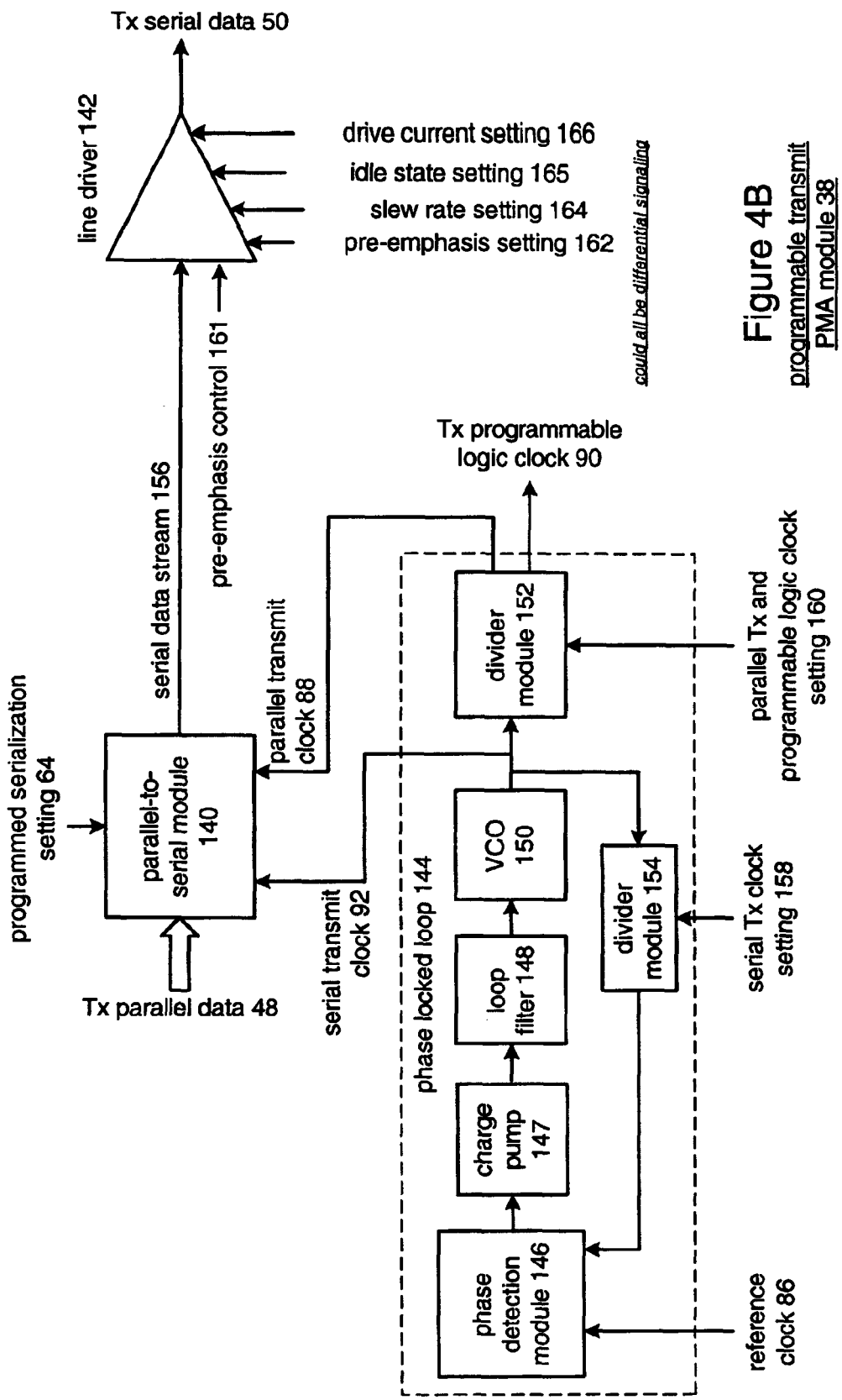

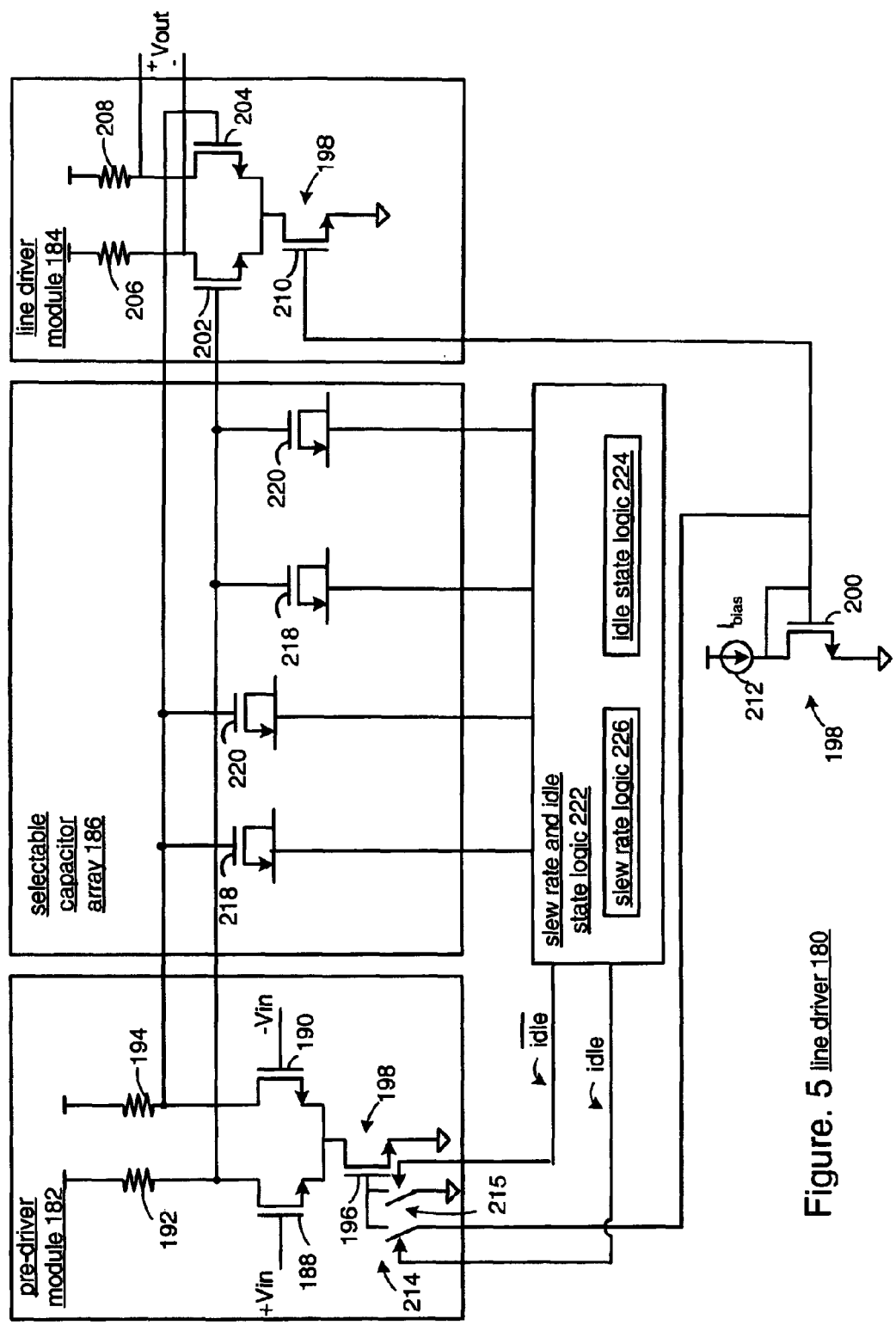
Figure. 5 line driver 180

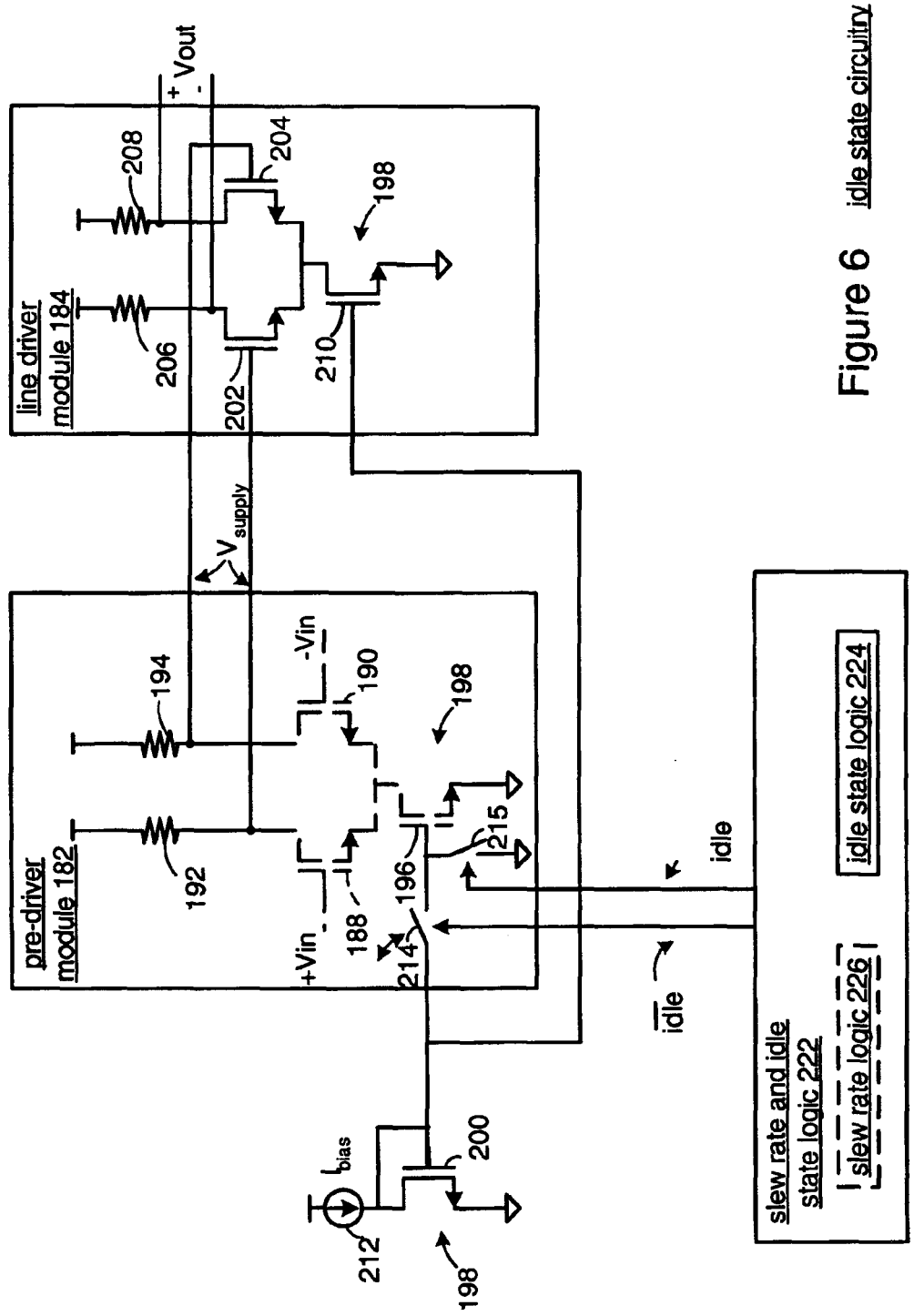
Figure 6    idle state circuitry

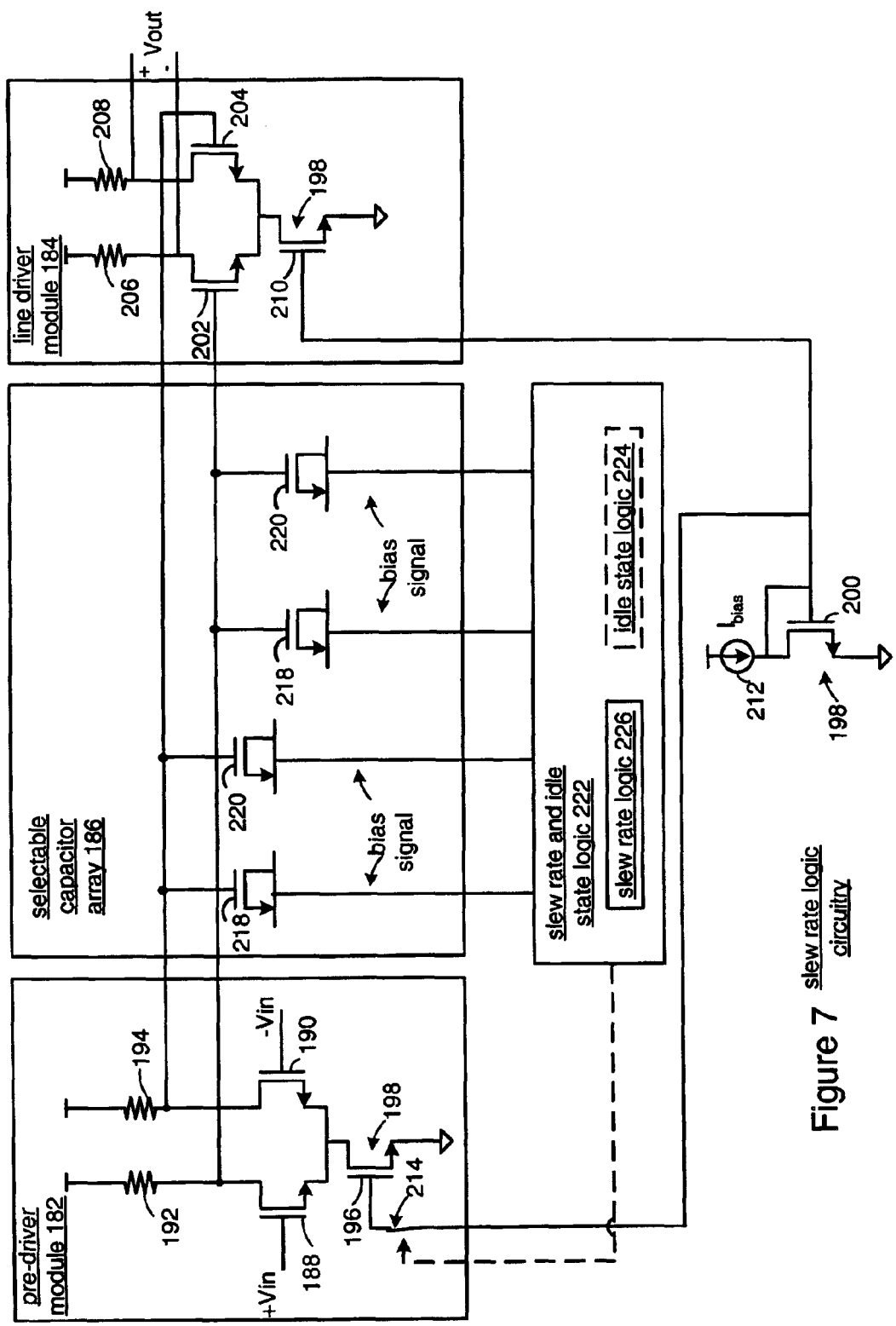
Figure 7 slew rate logic circuitry

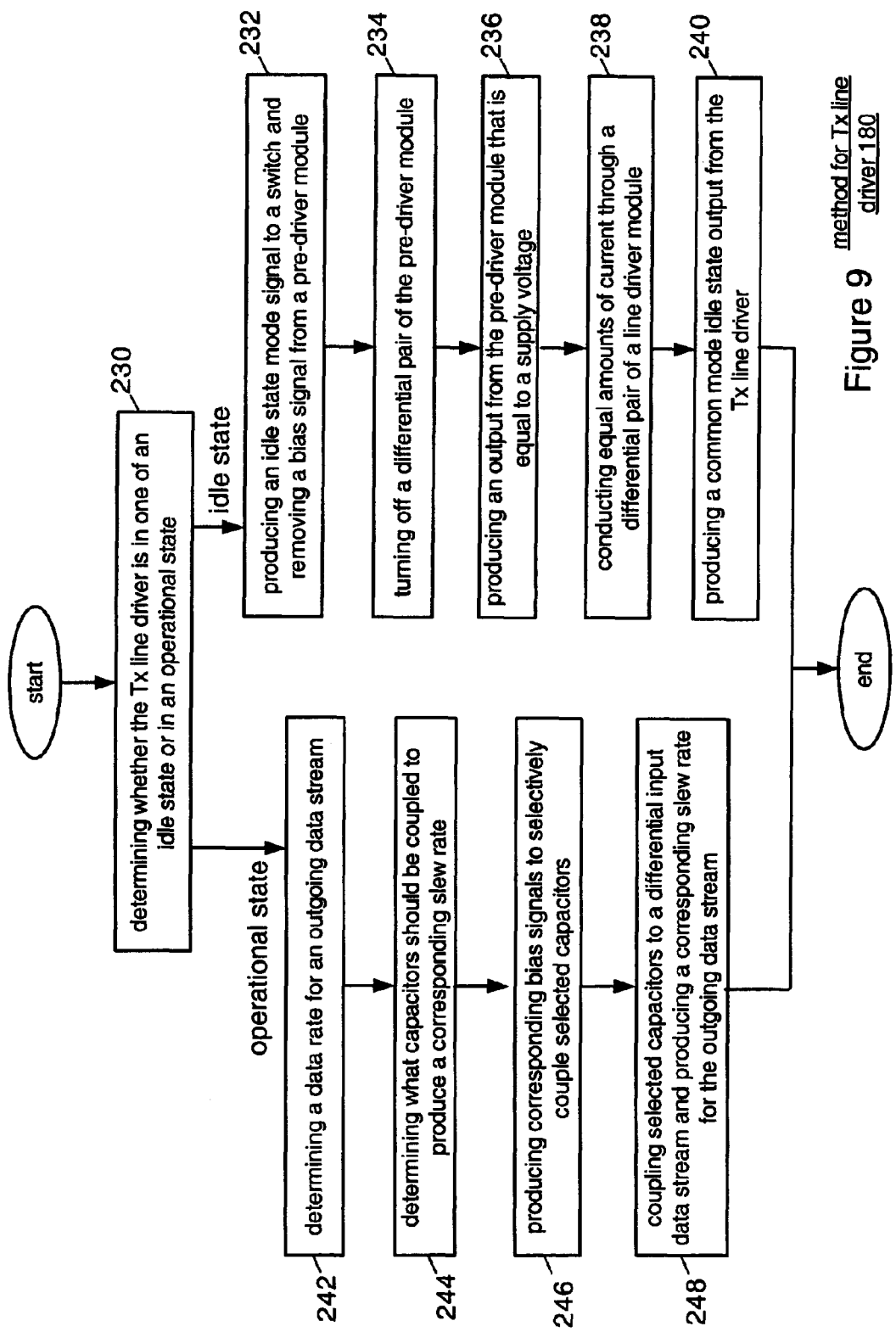

TX LINE DRIVER WITH COMMON MODE IDLE STATE AND SELECTABLE SLEW RATES

BACKGROUND OF THE INVENTION

1. Technical Field

This invention relates generally to communication systems and more particularly to line driver circuits used therein.

2. Description of Related Art

Communication systems are known to transport large amounts of data between a plurality of end user devices, which, for example, include telephones, facsimile machines, computers, television sets, cellular telephones, personal digital assistants, etc. As is also known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Synchronous Optical NETwork (SONET), for example, requires 10 gigabits per second. In accordance with such standards, many system components and end user devices of a communication system transport data via serial transmission paths. Internally, however, the system components and end user devices process data in a parallel manner. As such, each system component and end user device must receive the serial data and convert the serial data into parallel data without loss of information.

Accurate recovery of information from high-speed serial transmissions typically requires transceiver components that operate at clock speeds equal to or higher than the received serial data rate. Higher clock speeds limit the usefulness of prior art clock recovery circuits that require precise alignment of signals to recover clock and/or data. Higher data rates require greater bandwidth for a feedback loop of the recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits, where integrated circuit processing limits (e.g., device parasitics, trace sizes, propagation delays, device sizes, etc.) and integrated circuit (IC) fabrication limits (e.g., IC layout, frequency response of the packaging, frequency response of bonding wires, etc.) limit the speed at which the high-speed serial transceiver may operate without excessive jitter performance and/or noise performance.

A further alternative for high-speed serial transceivers is to use an IC technology that inherently provides for greater speeds. For instance, switching from a Complementary Metal Oxide Semiconductor (CMOS) process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for wide spread use.

Modern communication systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits per second for OC48, to 9.95 gigabits per second for OC192. Other known standards define data rates of 2.5 gigabits per second (INFINIBAND) or 3.125 gigabits per second (XAUI). These different data rates affect the allowable rise and fall time of the signal, the peak amplitude of the signal and the response time from an idle state. For example, one protocol may specify a peak voltage range of 200–400 millivolts, while another standard specifies a mutually exclusive voltage range of 500–700 millivolts. Thus, a designer either cannot satisfy these mutually exclusive requirements or must design a high data rate transceiver device that can adapt according to the protocol being used for the communications.

Along these lines, field programmable gate array (FPGA) circuits are gaining in popularity for providing the required flexibility and adaptable performance described above for those designers that seek to build one device that can operate according to multiple protocols. Thus, while FPGA technology affords a designer an opportunity to develop flexible and configurable hardware circuits, specific designs that achieve the desired operations must still be developed. For example, based on a transceiver's transmission rate, it is desirable to provide a transceiver design with an adaptive slew rate. Similarly, because response times may be very limited, especially for the higher data rate communication protocols, it is desirable to minimize a rise time from an idle state to an operational state. Accordingly, there is a need for an idle state mode of operation that reduces settle time and enables the transceiver device to produce a signal quickly.

BRIEF SUMMARY OF THE INVENTION

The present invention includes a transmit (Tx) line driver having a selectable slew rate and a common idle state mode and further including circuitry for selecting the slew rate and for placing the transmit line driver in the common idle state mode. A transmit line driver generally includes a pre-driver circuit that provides an input data stream to a current driver. The current driver then produces a corresponding output data stream at a specified current level that is sufficient to drive an output channel, circuit, etc. Coupled to a differential line carrying the input data stream is a plurality of selectable capacitors of a selectable capacitor array. Accordingly, the circuitry selects capacitors of the selectable capacitor array to calibrate a slew rate for the input data stream and, accordingly, for the output data stream produced by the current driver.

The circuitry further is coupled to select a switch to ground or remove a bias signal from the pre-driver circuit, and more specifically, a bias signal from a biasing device of the pre-driver circuit to prompt the pre-driver circuit to provide an output voltage of $V_{DD}$ (source voltage) to a pair of inputs of the current driver whenever a transmitter is in an idle state and is not producing an output data stream. The output voltage, which is coupled as an input of the current driver, causes the current driver to produce an output voltage that is at a specified level. In the described embodiment of the invention, responsive to device characteristics and resistor values of a resistor coupled between a drain and the source voltage, the output voltage of the current driver is at a specified level that is one half of a logic one value for the output data stream.

BRIEF DESCRIPTION OF THE DRAWINGS

FIG. 4B illustrates a schematic block diagram of a programmable transmit PMA module that includes a phase locked loop, a parallel-to-serial module, and line driver;

FIG. 5 is a functional schematic diagram of a line driver with selectable slew rates and a common idle state mode of operation according to one embodiment of the invention;

FIG. 6 is a functional schematic diagram that illustrates a first mode of operation of a Tx line driver formed according to one embodiment of the invention;

FIG. 7 is a functional schematic diagram that illustrates a second mode of operation of a Tx line driver formed according to one embodiment of the invention;

FIG. 9 is a flow chart illustrating operation of the present invention according to one embodiment of the present invention.

DETAILED DESCRIPTION OF THE INVENTION

Figure 1:
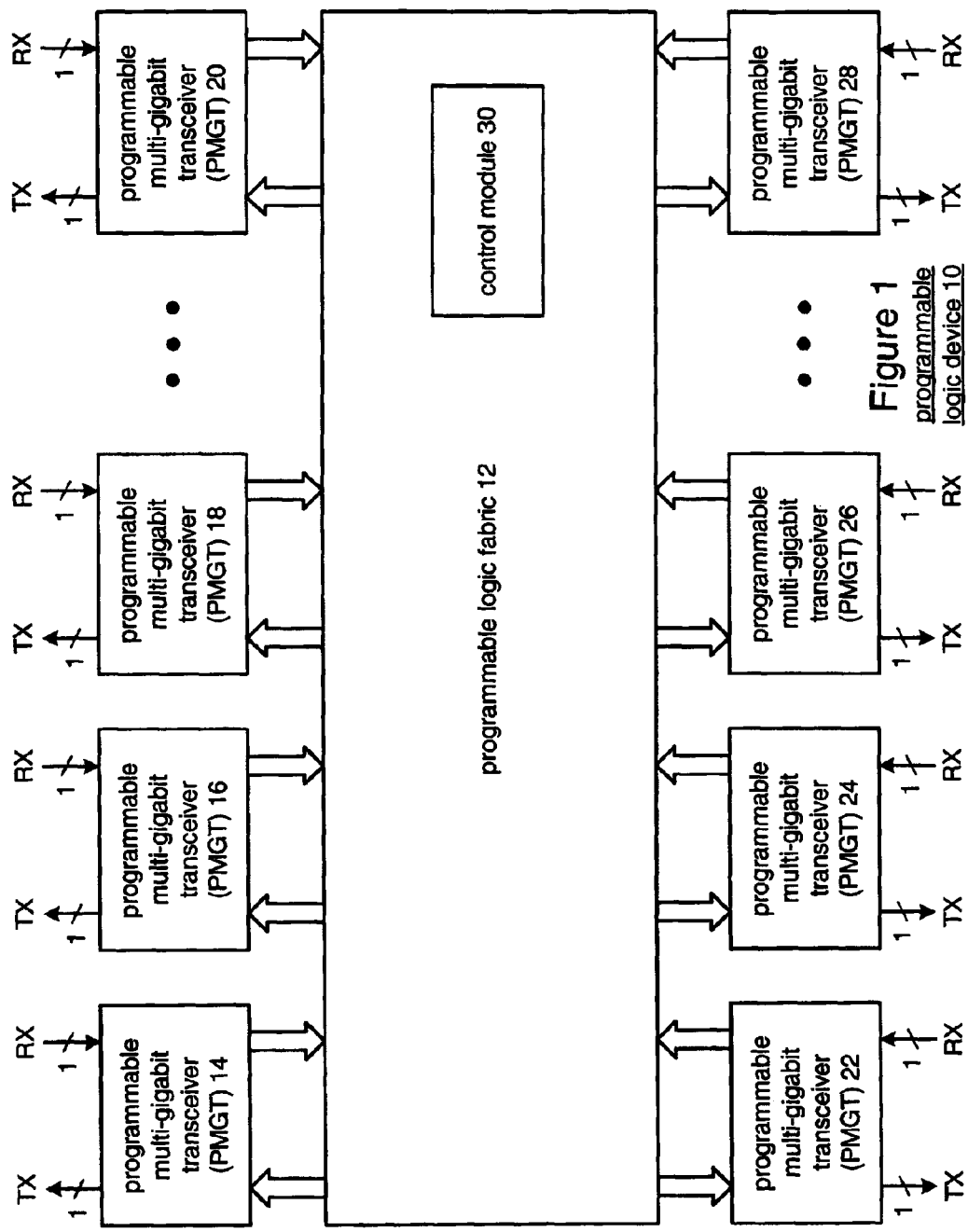
FIG. 1 is a schematic block diagram of a programmable logic device that includes programmable logic fabric, a plurality of programmable multi-gigabit transceivers (PMGTs) and a control module.

FIG. 1 is a schematic block diagram of a programmable logic device 10 that includes programmable logic fabric 12, a plurality of programmable multi-gigabit transceivers (PMGTs) 14–28 and a control module 30. The programmable logic device 10 may be a programmable logic array device, a programmable array logic device, an erasable programmable logic device, and/or a field programmable gate array (FPGA). When the programmable logic device 10 is an FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by programmable logic device 10.

The control module 30 may be contained within the programmable logic fabric 12 or it may be a separate module. In either implementation, the control module 30 generates the control signals to program each of the transmit and receive sections of the programmable multi-gigabit transceivers 14–28. In general, each of the programmable multi-gigabit transceivers 14–28 performs a serial-to-parallel conversion on received data and performs a parallel-to-serial conversion on transmit data. The parallel data may be 8-bits, 16-bits, 32-bits, 64-bits, etc.

Typically, the serial data will be a 1-bit stream of data that may be a binary level signal, multi-level signal, etc. Further, two or more programmable multi-gigabit transceivers may be bonded together to provide greater transmitting speeds. For example, if PMGTs 14, 16 and 18 are transceiving data at 3.125 gigabits-per-second, the PMGTs 14–18 may be bonded together such that the effective serial rate is 3 times 3.125 gigabits-per-second.

Each of the programmable multi-gigabit transceivers 14–28 may be individually programmed to conform to separate standards. In addition, the transmit path and receive path of each programmable multi-gigabit transceivers 14–28 may be separately programmed such that the transmit path of a transceiver is supporting one standard while the receive path of the same transceiver is supporting a different standard. Further, the serial rates of the transmit path and receive path may be programmed from 1 gigabit-per-second to tens of gigabits-per-second. The size of the parallel data in the transmit and receive sections, or paths, is also programmable and may vary from 8-bits, 16-bits, 32-bits, 64-bits, etc.

Figure 2:
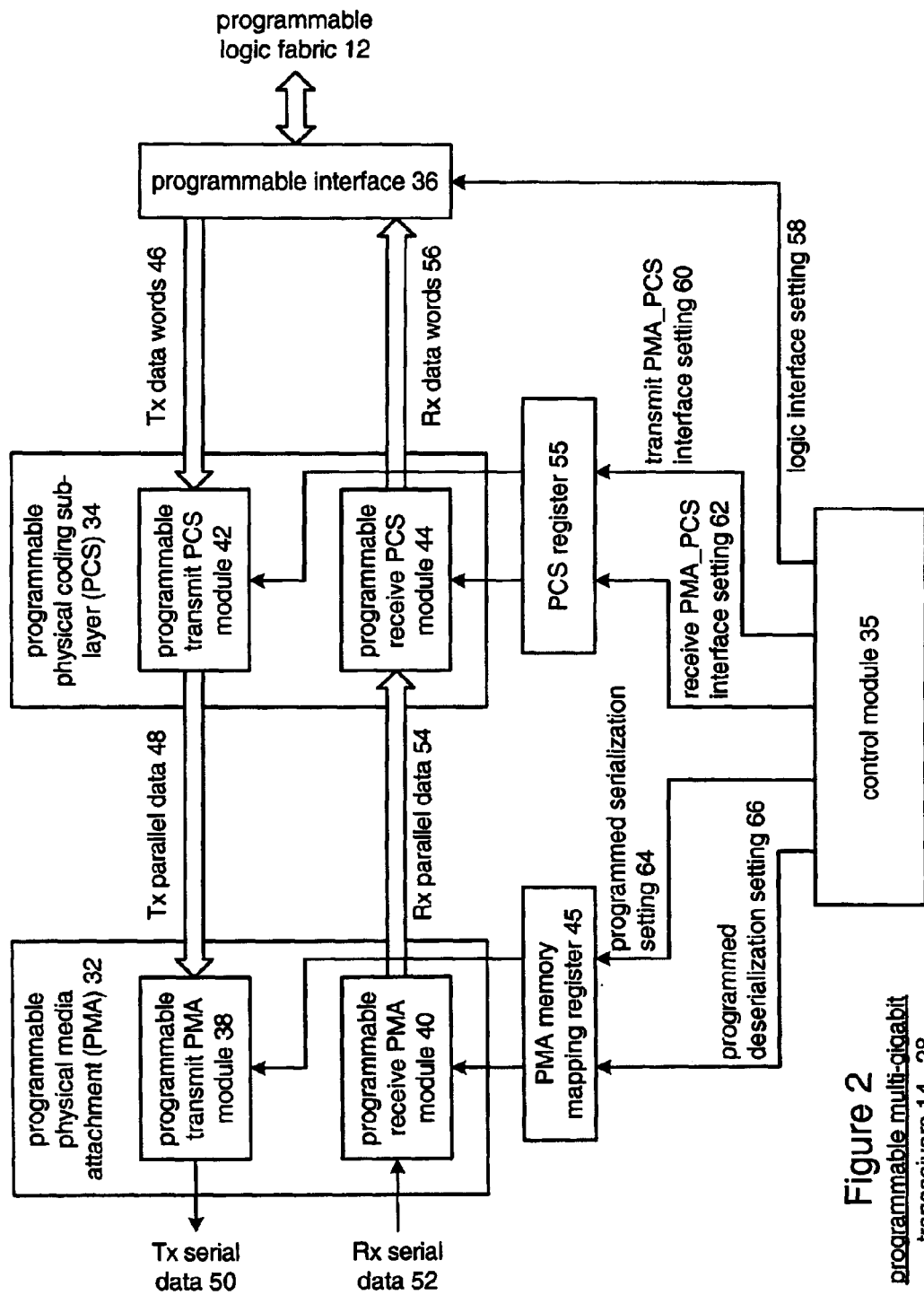
FIG. 2 is a schematic block diagram of one embodiment representing one of the programmable multi-gigabit transceivers.

FIG. 2 is a schematic block diagram of one embodiment representing one of the programmable multi-gigabit transceivers 14–28. As shown, the programmable multi-gigabit transceiver includes a programmable physical media attachment (PMA) module 32, a programmable physical coding sub-layer (PCS) module 34, a programmable interface 36, a control module 35, a PMA memory mapping register 45 and a PCS register 55. The control module 35, based on the desired mode of operation for the individual programmable multi-gigabit transceivers 14–28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the programmable multi-gigabit transceivers and/or included within the control module 30 (of FIG. 1). In either embodiment of the control module 35, the programmable logic device control module 30 determines the corresponding overall desired operating conditions for the programmable logic device 10 (of FIG. 1) and provides the corresponding operating parameters for a given multi-gigabit transceiver to its control module 35, which generates the settings 58–66.

The programmable physical media attachment (PMA) module 32 includes a programmable transmit PMA module 38 and a programmable receive PMA module 40. The programmable transmit PMA module 38, which will be described in greater detail with reference to FIG. 4B, is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable physical coding sub-layer (PCS) module 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., 1-byte, 2-bytes, 3-bytes, 4 bytes, etc.) and the corresponding transmission rate of the transmit parallel data 48. The programmable receive PCS module 44 converts the receive parallel data 54 into receive data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA 32 and programmable PCS 34 may be individually programmed to support a desired data transfer rate. The data transfer rate may be in accordance with a particular standard such that the receive path, i.e., the programmable receive PMA module 40 and the programmable receive PCS module 44 may be programmed in accordance with one standard, while the transmit path, i.e., the programmable transmit PCS module 42 and the programmable transmit PMA module 38 may be programmed in accordance with another standard.

Figure 3:
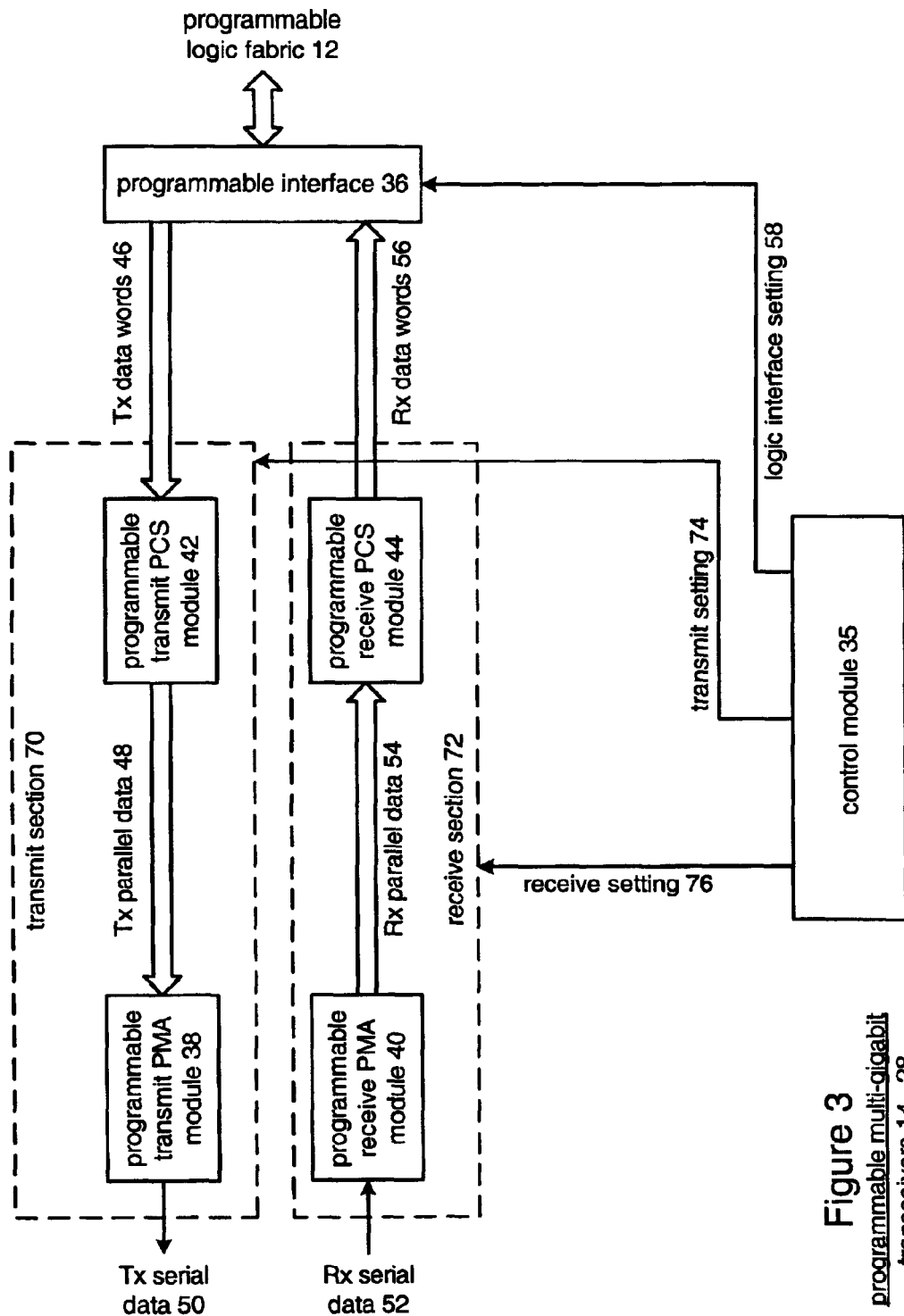
FIG. 3 illustrates an alternate schematic block diagram representing one of the programmable multi-gigabit transceivers.

FIG. 3 illustrates an alternate schematic block diagram representing one of the programmable multi-gigabit transceivers 14–28. In this embodiment, the programmable multi-gigabit transceivers 14–28 include a transmit section 70, a receive section 72, the control module 35 and the programmable interface 36. The transmit section 70 includes the programmable transmit PMA module 38 and the programmable transmit PCS module 42. The receive section 72 includes the programmable receive PMA module 40 and the programmable receive PCS module 44.

In this embodiment, the control module 35 separately programs the transmit section and the receive section via transmit setting 74 and receive setting 76, respectively. The control module 35 also programs the programmable interface 36 via the logic interface setting 58. Accordingly, the control module 35 may program the receive section 72 to function in accordance with one standard while programming the transmit section 70 in accordance with another standard. Further, the logic interface setting 58 may indicate that the transmit data words 46 are received from the programmable logic fabric 12 at a different rate than the receive data words 56 are provided to the programmable logic fabric 12. As one of average skill in the art will appreciate, the programmable interface 36 may include a transmit buffer and a receive buffer, and/or an elastic store buffer to facilitate the providing and receiving of transmit data words 46 and receive data words 56 to and from the programmable logic fabric 12.

Figure 4A:
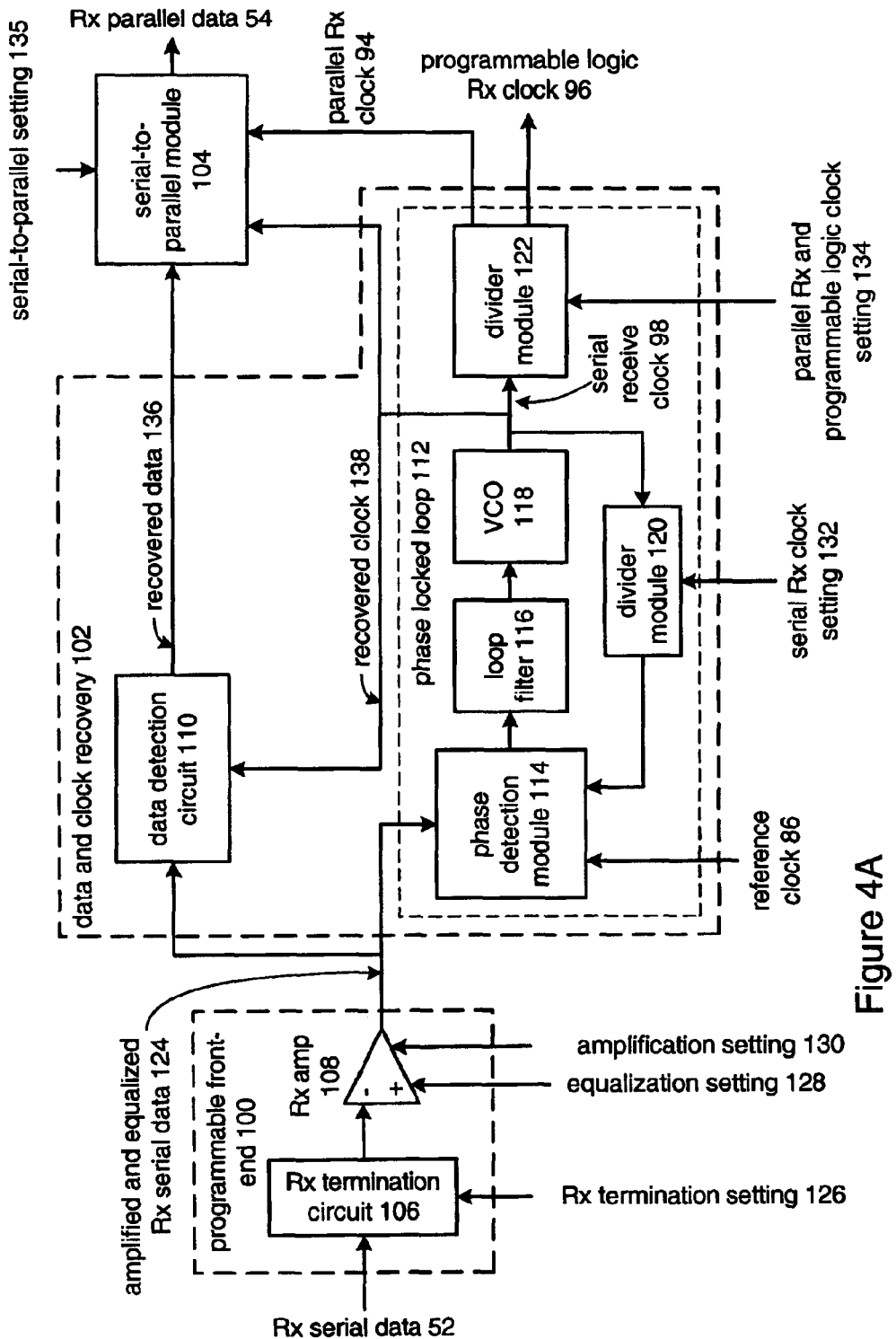
FIG. 4A illustrates a schematic block diagram of a programmable receive PMA module that includes a programmable front-end, a data and clock recovery module, and a serial-to-parallel module.

FIG. 4A illustrates a schematic block diagram of the programmable receive PMA module 40 that includes a programmable front-end 100, a data and clock recovery module 102, and a serial-to-parallel module 104. The programmable front-end 100 includes a receive termination circuit 106 and a receive amplifier 108. The data and clock recovery module 102 includes a data detection circuit 110 and a phase locked loop 112. The phase locked loop 112 includes a phase detection module 114, a loop filter 116, a voltage controlled oscillator (VCO) 118, a $1^{st}$ divider module 120, and a $2^{nd}$ divider module 122.

The programmable front-end 100 is operably coupled to receive the receive serial data 52 and produce amplified and equalized receive serial data 124 therefrom. To achieve this, the receive termination circuit 106 is programmed in accordance with a receive termination setting 126 to provide the appropriate termination for the transmission line between the programmable receive PMA module 40 and the source that originally transmitted the receive serial data 52. The receive termination setting 126 may indicate whether the receive serial data 52 is a single-ended signal, a differential signal, may indicate the impedance of the termination line, and may indicate the biasing of the receive termination circuit 106. For a more detailed discussion of the receive termination circuit 106, refer to co-pending patent application entitled RECEIVER TERMINATION NETWORK AND APPLICATION THEREOF, by Charles W. Boecker et al., and having the same filing date as the present application and which is herein incorporated by reference.

The receive termination circuit 106 further biases the receive serial data 52 and provides the bias adjusted signal to the receive amplifier 108. The gain and equalization settings of the receive amplifier 108 may be adjusted in accordance with the equalization setting 128 and the amplification setting 130, respectively. The receive amplifier 108 may be further described in co-pending patent application entitled ANALOG FRONT-END HAVING BUILT-IN EQUALIZATION AND APPLICATIONS THEREOF, by William C. Black et al., and a filing date the same as the present patent application and which is herein incorporated by reference. Note that the receive termination setting 126, the equalization setting 128, and the amplification setting 130 are part of the programmed deserialization setting 66 provided by the control module 35.

The data and clock recovery module 102 receives the amplified and equalized receive serial data 124 via the phase detection module 114 of phase locked loop 112 and via the data detection circuit 110. The phase detection module 114 has been initialized prior to receiving the amplified and equalized receive serial data 124 by comparing the phase and/or frequency of a reference clock 86 with a feedback reference clock produced by divider module 120. Based on this phase and/or frequency difference, the phase detection module 114 produces a corresponding current that is provided to loop filter 116. The loop filter 116 converts the current into a control voltage that adjusts the output frequency of the VCO 118. The divider module 120, based on a serial receive clock setting 132, divides the output oscillation produced by the VCO 118 to produce the feedback signal. Once the amplified and equalized receive serial data 124 is received, the phase detection module 114 compares the phase of the amplified and equalized receive serial data 124 with the phase of the amplified and equalized receive serial data 124. Based on a phase difference between the amplified and equalized receive serial data 124 and the feedback signal, a current signal is produced.

The phase detection module 114 provides the current signal to the loop filter 116, which converts it into a control voltage that controls the output frequency of the VCO 118. At this point, the output of the VCO 118 corresponds to a recovered clock 138. The recovered clock 138, which was referenced as the serial receive clock 98 in FIG. 4, is provided to the divider module 122, the data detection circuit 110 and to the serial-to-parallel module 104. The data detection circuit 110 utilizes the recovered clock 138 to recovered data 136 from the amplified and equalized receive serial data 124. The divider module 122 divides the recovered clock 138, in accordance with a parallel receive and programmable logic clock setting 134, to produce a parallel receive clock 94 and a programmable logic receive clock 96. Note that the serial receive clock setting 132 and the parallel receive and programmable logic clock setting 134 are part of the programmed deserialization setting 66 provided to the programmable receive PMA module 40 by the control module 35.

The serial-to-parallel module 104, which may include an elastic store buffer, receives the recovered data 136 at a serial rate in accordance with the recovered clock 138. Based on a serial-to-parallel setting 135 and the parallel receive clock 94, the serial-to-parallel module 104 outputs the receive parallel data 54. The serial-to-parallel setting 135, which may be part of the programmed deserialization setting 66, indicates the rate and data width of the receive parallel data 54.

FIG. 4B illustrates a schematic block diagram of a programmable transmit PMA module 38 that includes a phase locked loop 144, a parallel-to-serial module 140, and a line driver 142. The phase locked loop 144 includes a phase detection module 146, a charge pump 147, a loop filter 148, a voltage control oscillator (VCO) 150, a divider module 154, and a divider module 152.

The phase detection module 146 compares the phase and/or frequency of the reference clock 86 with the phase and/or frequency of a feedback oscillation produced by divider module 154. The phase detection module 146 generates control signals to charge pump 147 which, in turn, produces a current signal to represent the phase and/or frequency difference between the reference clock 86 and the feedback oscillation in one embodiment of the invention. The loop filter 148 converts the current signal into a control voltage that regulates the output oscillation produced by the VCO 150. Divider module 154, based on a serial transmit clock setting 158, divides the output oscillation of the VCO 150, which corresponds to a serial transmit clock 92, to produce the feedback oscillation. Note that the serial transmit clock setting 158 may be part of the programmed serialization setting 64 provided to the programmable transmit PMA module 38 by the control module 35.

Divider module 152 receives the serial transmit clock 92 and, based on a parallel transmit and programmable logic clock setting 160, produces a parallel transmit clock 88 and a transmit programmable logic clock 90. The parallel transmit and programmable logic clock setting 160 may be part of the programmed serialization setting 64.

The parallel-to-serial module 140 receives the transmit parallel data 48 and produces therefrom a serial data stream 156. To facilitate the parallel-to-serial conversion, the parallel-to-serial module 140, which may include an elastic stored buffer, receives a parallel-to-serial setting to indicate the width of the transmit parallel data 48 and the rate of the transmit parallel data, which corresponds to the parallel transmit clock 88. Based on the parallel-to-serial setting, the serial transmit clock 92 and the parallel transmit clock 88, the parallel-to-serial module 140 produces the serial data stream 156 from the transmit parallel data 48.

The line driver 142 increases the power of the serial data stream 156 to produce the transmit serial data 50. The line driver 142, which is further described in greater detail in co-pending U.S. patent application, DAC BASED DRIVER WITH SELECTABLE PRE-EMPHASIS SIGNAL LEVELS, by Eric D. Groen, et. al., with a filing date the same as the present patent application, and which is herein incorporated by reference. The line driver 142 may be programmed to adjust its pre-emphasis settings, slew rate settings, and drive settings via a pre-emphasis control signal 161, a pre-emphasis setting signal 162, a slew rate setting signal 164, an idle state setting 165 and a drive current setting 166. The pre-emphasis control signal 161, pre-emphasis setting signal 162, the slew rate setting signal 164, the idle state setting 165 and the drive current setting 166 may be part of the programmed serialization setting 64. As one of average skill in the art will appreciate, while the diagram of FIG. 4B is shown as a single-ended system, the entire system may be differential signaling and/or a combination of differential and single-ended signaling.

FIG. 5 is a functional schematic diagram of a line driver with selectable slew rates and a common idle state mode of operation according to one embodiment of the invention. A line driver 180 includes a pre-driver module 182 that is coupled to produce a differential input data stream to a line driver module 184. Coupled to a differential input line that carries the input data stream is a selectable capacitor array 186. Selectable capacitor array 186 provides a plurality of selectable capacitor configured MOSFETs that may be selectively coupled to the differential input line to provide a slew rate that corresponds to a data rate of the input data stream.

Pre-driver module 182 includes a differential pair of MOSFETs 188 and 190 and a pair of load resistors 192 and 194 coupled between the drains of MOSFETS 188 and 190 and a supply, respectively. The differential pair of the pre-driver module 182 are biased by MOSFET 196. MOSFET 196 is part of a current mirror 198 and is coupled as a mirror device, meaning it conducts a current that is a function of a reference current produced by MOSFET 200 that is coupled as a reference device in the current mirror 198.

More specifically, with respect to the current produced by the reference device in relation to current produced by the mirror device as a function of the reference current, the amount of current in the two devices is generally proportional and their magnitudes are a function of the scaling of the devices in relation to each other. For two equally scaled devices configured as a current mirror, the current produced by the mirror device matches the current produced by the reference device. In the described embodiment, however, the mirror devices are scaled to produce approximately five times more current than the reference device conducts for a similar bias voltage applied across the gate and source of the device.

Similarly, line driver module 184 comprises a differential pair of MOSFETs 202 and 204 having drains coupled to load resistors 206 and 208, respectively, that are further coupled to the supply. The differential pair of MOSFETs of line driver module 184 are also coupled, at the source terminals, to MOSFET 210 which is coupled as a mirror device of current mirror 198. MOSFET 210 also produces a bias current to the differential pair of MOSFETs 202 and 204 that is a function of the reference current conducted by MOSFET 200 of current mirror 198.

As may further be seen, the amount of current conducted by MOSFET 200, the reference device of the current mirror, is set by a current source 212. A drain and a gate of MOSFET 200 are coupled to a gate of MOSFETs 196 and 210 in a typical current mirror configuration. Thus, if the desired output current level of line driver module 184 is ten milliamps, and MOSFET 210 is scaled to conduct five times more current than MOSFET 200 of current mirror 198, the current source 212 should be designed to provide two milliamps of current because of the relative scaling of the devices in current mirror 198.

A selectable switch 214 is further coupled to the gate (input) of MOSFET 196 to selectively provide the bias signal to MOSFET 196. Accordingly, when the selectable switch 214 is opened, MOSFET 196 turns off thereby turning off MOSFETs 188 and 190 of the differential pair of pre-driver module 182. When MOSFETs 188 and 190 are off, the drains of MOSFETs 188 and 190, which are coupled to the load resistors 192 and 194, respectively, go to the supply and produce the supply voltage as an output.

During normal operation, when an input data stream is being received at the gates of the differential pair of MOSFETs 188 and 190, pre-driver module 182 produces a differential input data stream to line driver module 184. When switch 214 is open and line driver 180 is in an idle state, pre-driver module 182 produces the supply voltage on both output lines comprising the differential input of line driver module 184. $V_{out}$ is the differential output of line driver module 184.

As pre-driver module 182 produces the supply voltage on the differential input line of line driver module 184, the gates of the differential pair of MOSFETs 202 and 204, which are coupled to the differential input line to receive either the supply voltage or the input data stream produced by pre-driver module 182, produce an idle state common mode output or an output data stream, respectively.

If an input data stream is being received at the gates of MOSFETs 202 and 204, the line driver 184 operates in a normal mode and produces the output data stream.

Also coupled to the differential input line of line driver module 184 is a selectable capacitor array 216. Capacitor array 186. Selectable capacitor array 186 216 comprises a plurality of selectable capacitors 218 and 220 that may be selectably coupled to the differential input line to set or adjust a slew rate of the output data stream produced by line driver module 184. In one embodiment of the invention, all of the capacitors 218 and 220 of selectable capacitor array 186 are selectable.

In an alternate embodiment, at least one capacitor 218 (actually a pair of capacitors 218) is permanently coupled to each input line of the differential input line to set a slew rate for the highest data rate of an output data stream produced by line driver module 184 and is permanently biased into an operational mode. Capacitors 218 and 220 are scaled differently in the described embodiment to provide different amounts of capacitance according to design requirements. As a slew rate requires reducing for a slower data rate serial data, selectable capacitors 220 of varying sizes may be added. Such capacitance values may readily be determined by one of average skill in the art.

In the described embodiment, however, all of the capacitors 218 and 220 are selectable. Further, that only two capacitors are shown for each differential input shown by no means limit the number of capacitors of various sizes that can and should be added to produce one of a plurality of specified slew rates. Accordingly, additional capacitors 218 are selectively coupled to each line of the differential input line to adjust the slew rate for slower data rates for the output data stream.

As is known by one of average skill in the art, one may merely add a capacitance of capacitors coupled in parallel, thus facilitating the addition of additional capacitors of the selectable capacitor array to adjust the slew rate. As capacitance increases, a total charge time increases thereby increasing the rise time of the bits of the input data stream (the slew rate of the input data stream).

In the described embodiment of the invention, the capacitors 218 are actually capacitor configured MOSFETs 218 and 220 coupled to each differential input line of the line driver module 184. Accordingly, a bias signal received by each MOSFET 218 or 220 biases the capacitor configured MOSFETs 218 and 220 into an operational state. In one embodiment the other end of the capacitors 218 and 220 are coupled to the slew rate logic 226, where the slew rate logic 226, includes circuitry comprising the slew rate setting 164 signal connected to two inverters in series which in turn are connected to the other end of the capacitors 218 and 220 (or in another embodiment the slew rate setting 164 signal is connected directly to the other end of the capacitors 218 and 220, i.e., the slew rate setting 164 signal is the bias signal). In place of capacitor configured MOSFETs, however, one may include actual capacitors that are switched in and out of coupling with a selectable switch, where, in one embodiment, one end of the selectable switch is connected to ground and the other end to the capacitor and the control to the switch is provided by the slew rate logic 226, which is directly or indirectly connected to the slew rate setting 164. Line driver 180 further includes slew rate and idle state logic 222. Slew rate and idle state logic 222 further includes slew rate logic block 226 and idle state logic block 224. Idle state logic block 224 produces an idle signal to open switch 214 to remove a bias signal from MOSFET 196 of current mirror 198. Accordingly, when idle state logic block 224 produces the idle signal, a bias signal is removed from MOSFETs 188 and 190 of the differential pair of pre-driver module 182 to turn off MOSFETs 188 and 190 to cause pre-driver module 182 to output the supply voltage as has been described above. The logic of idle state logic block 224 and slew rate logic block 226 may be formed in programmable logic fabric 12 of FIG. 1 or in control modules 30 and 35, among, other places according to design preferences. As may also be seen, a switch 215 is provided to ground the gate of MOSFET 196 whenever switch 214 is opened to remove the bias signal from MOSFET 196 in order to ensure that the MOSFET is biased into a non-operational mode. In one embodiment the idle logic block 224 includes circuitry comprising two series connected inverters connected to the idle state setting 165. The output of the first inverter is the idle bar (complement of idle) signal and the output of the second inverter is the idle signal (FIG. 6).

Slew rate logic block 226 is coupled to receive a data rate indication and produces corresponding bias signals to MOSFETs 218 or 220 to selectively couple (biasing to an on state) 218 or 220 to each line of the differential input line to adjust the slew rate to a value that corresponds with the received data rate. For example, if line driver 180 supports only two data rates, then slew rate logic block 226 selects one of two combinations of capacitors to establish one of two corresponding slew rates. In one embodiment of the invention, four different slew rates are selectable and are provided for. It is understood that the number of actual selectable slew rates is a matter of choice for one practicing the invention.

To clarify operation of the present invention, FIGS. 6 and 7 are functional schematic diagrams that illustrate the various modes of operation of line driver 180. Referring now to FIG. 6, the idle state mode of operation is illustrated. As may be seen, selectable capacitor array 186 is not shown in FIG. 6. Moreover, the corresponding slew rate logic block 226 is shown in dashed lines. While the line driver 180 is in an operational mode, the idle state logic block 224 does not assert the idle signal to cause switch 214 to remain closed and switch 215 to remain open. The operational mode idle signal produced by idle state logic block 224 is shown in FIG. 6. When idle state logic block 224 asserts the idle signal during an idle mode, however, switch 214 opens to remove a bias signal from MOSFET 196 of current mirror 198. Similarly, switch 215 closes to ground the gate of MOSFET 196. Because this results in MOSFETs 196, 188 and 190 being turned off, MOSFETs 196, 188 and 190 are shown in dashed lines. As the impedance of a gate terminal, and more specifically, the gates of MOSFETs 202 and 204 approach infinity, the output nodes of pre-driver module 182 approach the supply voltage because no current is conducted through the load resistors 192 and 194. Accordingly, the output voltage of $V_{supply}$ is produced from pre-driver module 182.

As is known by one of average skill in the art, only one of the differential MOSFETs will be on at a time and producing an output during an operational mode. Accordingly, the output signal magnitude is a function of the bias current produced by MOSFET 210 of current mirror 198 and a value of the load resistors 206 and 208. When both MOSFETs 202 and 204 are on during idle state mode of operation because both gates are receiving the supply voltage produced by pre-driver module 182, however, the current in each differential MOSFET 202 and 204 is one half of the current in MOSFET 210. Accordingly, a differential output produced at the drains of MOSFETs 202 and 204 has one half of the signal magnitude of an output signal produced during normal operation.

Referring now to FIG. 7, the idle state logic block 224, the line that carries the idle signal, as well as switch 214 are all shown in dashed lines to indicate that they need not be electrically present for the purpose of this discussion. The operation of slew rate logic block 226 is as described. Slew rate logic block 226 produces bias signals to capacitor configured MOSFETs 218 and 220 to selectively couple the capacitor configured MOSFETs 218 and 220 to provide a slew rate that corresponds with a serial data rate.

Figure 8:
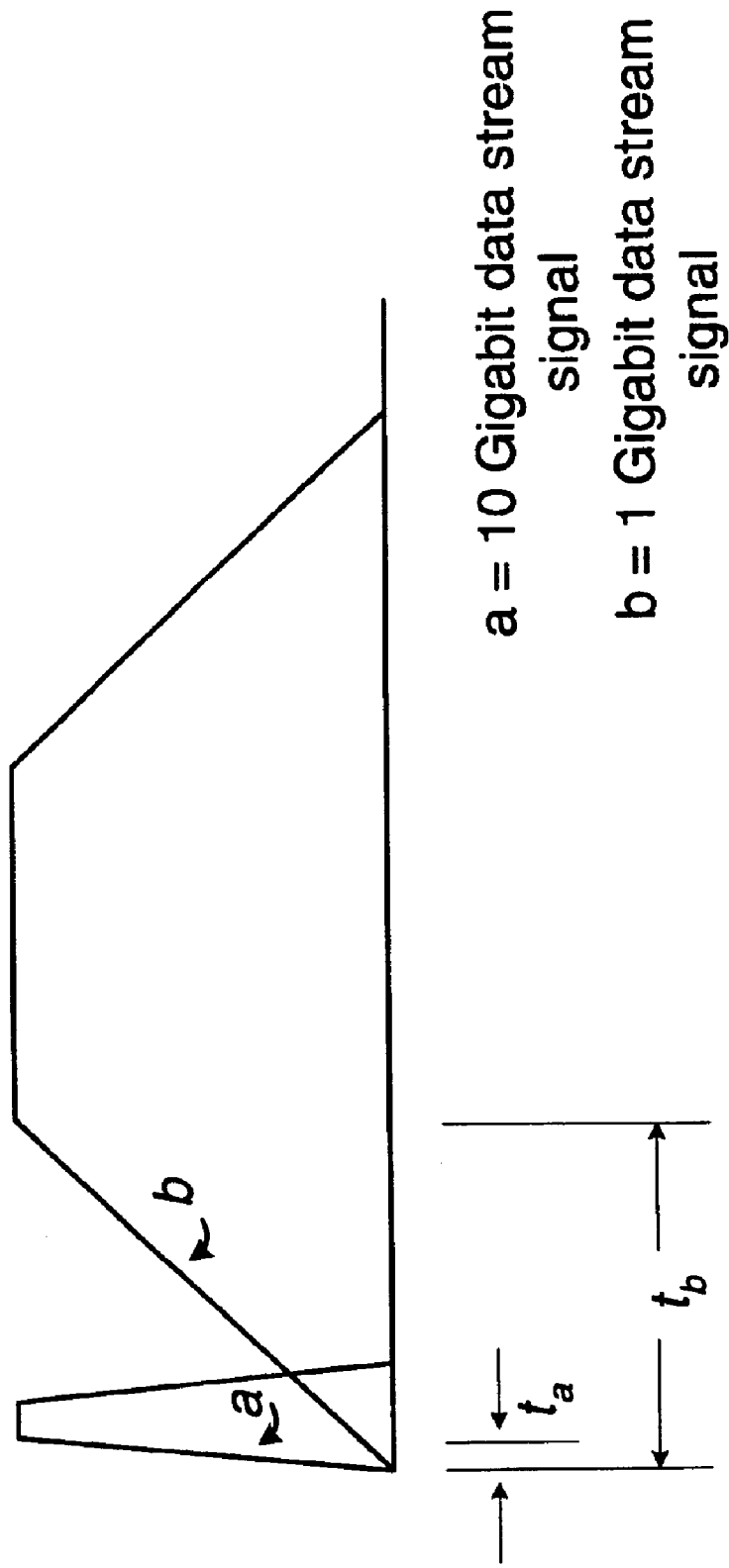
FIG. 8 is a signal diagram showing a logic one signal transmitted at two different rates and the corresponding slew rates.

FIG. 8 is an example of a signal diagram showing a logic one signal transmitted at two different rates and the corresponding slew rates. This example is for illustration purposes only. For example, signal "a" might be a 10 Gigabit input data stream signal while signal "b" might be a 1 Gigabit output data stream signal. The rise time of signal "a" is shown as "$t_a$" while the rise time of signal b is shown as "$t_b$". The slew rate corresponds to these shown rise times. Thus, by adding capacitance to the input data stream, the rise time transitions from $t_a$ to $t_b$ thereby decreasing the slew rate.

FIG. 9 is a flow chart illustrating operation of the present invention according to one embodiment of the present invention. Initially, the inventive method includes determining whether the Tx line driver, for example, line driver 180, is in one of an idle state or in an operational state (step 230). If the Tx line driver is in an idle state, steps 232 through 240 are performed. If the Tx line driver is in an operational state, then steps 242 though 248 are performed.

If the Tx line driver is in an idle state, the next step of the invention includes producing an idle state mode signal to a switch and removing a bias signal from a pre-driver module (step 232). In one embodiment of the invention, a switch configured MOSFET is coupled in series with a gate of a MOSFET that provides a bias signal to a differential pair of the pre-driver module. Thus, to open the circuit and remove the bias signal, the idle state mode signal is one that turns off the switch configured MOSFET to open a connection between a bias signal and the gate of the MOSFET that provides the bias signal to differential pair of the pre-driver module.

Thereafter, the method includes turning off a differential pair of the pre-driver module (step 234) and producing an output from the pre-driver module that is equal to a supply voltage (step 236). Because the bias signal to the differential pair is removed, the MOSFETS of the differential pair are turned off causing a differential output of the pre-driver module to go to the supply voltage.

As the output of the pre-driver module goes to the supply voltage, both MOSFETS of a differential pair of a line driver module are biased into an on state. Because the current level through a biasing MOSFET is fixed by a current mirror configuration, the total bias current is divided through each MOSFET of the differential pair of the line driver module. Thus, the method includes conducting equal amounts of current through the differential pair of the line driver module (step 238). This equal amount of current is one half of a signal magnitude during normal operation. Accordingly, the voltage drop across a pair of load resistors coupled to the drains of the differential pair of the line driver module is one half, thereby producing a common mode idle state output from the Tx line driver (step 240).

If the Tx Line driver is in an operational state, the method includes determining a data rate for an outgoing data stream (step 242). In one embodiment of the invention, the data rate is received from external logic. Based upon the received data rate during normal operation, the invention further includes determining what capacitors should be coupled to produce a corresponding slew rate (step 244) and producing corresponding bias signals to selectively couple selected capacitors (step 246). Thus, the invention includes coupling selected capacitors to a differential input data stream and producing a corresponding slew rate for the outgoing data stream (step 248).

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A TX line driver with a common mode idle state and selectable slew rates, comprising:
   a pre-driver module for producing a differential input data stream, the pre-driver coupled to a supply voltage;
   a differential line driver module further including a pair of devices coupled to receive the differential input data stream at a line driver differential input;

a capacitor array further including at least one capacitor coupled to each input of the line driver differential input;

a selectable switch coupled to provide a bias signal to the pre-driver circuit wherein the pre-driver circuit produces an output voltage that is equal to the supply voltage when the bias signal is removed by the selectable switch; and circuitry for producing:

during an idle state, an idle state signal to select switch position to remove the bias signal to the pre-driver module; and during an operational state (non-idle state), a bias signal to couple at least one selectable capacitor of the capacitor array to each input of the differential inputs to set a specified slew rate.

2. The Tx line driver of claim 1 wherein the circuitry, during an idle state, generates an idle state signal to open a connection to a line providing the bias signal to the pre-driver module.

3. The TX line driver of claim 1 wherein the pre-driver module comprises a differential input pair that turn off when the idle state signal is produced by the circuitry wherein an output voltage floats to the supply voltage responsive to the differential input pair being turned off.

4. The Tx line driver of claim 1 wherein the circuitry, during an operational state, selects the at least one capacitor coupled to each input of the differential inputs to select a slew rate that correspond with a specified data rate.

5. The Tx line driver of claim 4 wherein the capacitors comprise capacitor configured MOSFETS.

6. The Tx line driver of claim 4 wherein the at least one capacitor is coupled in series with a selectable switch that provides a connection to ground responsive to receiving a slew rate logic signal.

7. The TX line driver of claim 5 wherein circuitry generates at least two bias signals to select at least two capacitors to reduce a slew rate from a first value to a second value.

8. The Tx line driver of claim 5 wherein the circuitry generates at least four bias signals to select at least four capacitors wherein each of two inputs of the differential input is coupled to a pair of selectable capacitors.

9. A Tx line driver with a common mode idle state, comprising:

a pre-driver module for producing a differential input data stream, the pre-driver module coupled to a supply voltage;

a differential line driver module further including a pair of devices coupled to receive the differential input data stream at a line driver differential input wherein the differential line driver module produces an output data stream characterized by a specified signal magnitude;

a selectable switch coupled to provide a bias signal to the pre-driver module wherein the pre-driver module produces an output voltage that is equal to the supply voltage when the bias signal is removed by the selectable switch;

circuitry for selecting a switch position to remove the bias signal to the pre-driver module; and wherein, when the pair of devices of the differential line driver module receive a signal at the same time from the pre-driver module, the pair of devices of the differential line driver module produce an output equal to one half of the specified signal magnitude.

10. The Tx line driver of claim 9 wherein the circuitry, during an idle state, generates an idle state signal to open a connection to a line providing the bias signal to the pre-driver module.

11. The Tx line driver of claim 9 wherein the pre-driver module comprises a differential input pair that turn off when the idle state signal is produced by the circuitry wherein an output voltage floats to the supply voltage responsive to the differential input pair being turned off.

12. A Tx line driver with a common mode idle state, comprising:

a pre-driver module for producing an input data stream, the pre-driver module coupled to a supply;

a differential line driver module coupled to receive the input data stream at a differential input;

a selectable switch coupled to provide a bias signal to the pre-driver module wherein the pre-driver module produces, an output voltage that is equal to the supply voltage when the bias signal is removed by the selectable switch; and logic for setting an idle state indication wherein the idle state indication selects a switch position to remove the bias signal to the pre-driver module to provide a supply voltage to each of two inputs of the differential line driver module wherein the differential line driver module provides common mode level output level upon receiving the supply voltage at each of the two inputs.

13. The Tx line driver of claim 12 wherein:

the pre-driver module includes a first differential pair with first and second drains and a first current mirror stage; and the differential line driver module includes a second differential pair and a second current mirror stage, the second differential pair having first and second gates coupled to the first and second drains, respectively, of the first differential pair, wherein the first and second current mirror stages provide bias signals to the first and second differential pairs of the pre-driver module and the differential line driver module, respectively.

14. The Tx line driver of claim 13 wherein a selectable switch is coupled to a gate of a MOSFET forming the first current mirror stage and wherein the logic for setting an idle state indication opens the selectable switch to bias both devices the first differential pair into an off state to cause the drains of the first differential pair to go to the supply voltage.

15. The Tx line driver of claim 14 wherein, responsive to the drains of the first differential pair being at supply, the MOSFET devices of the second differential pair are both biased to an on state to provide a selected common mode level.

16. A Tx line driver with selectable slew rates, comprising:

a pre-driver module for producing an input data stream, the pre-driver module coupled to a supply;

a differential line driver module further including a pair of devices coupled to receive the input data stream at a line driver differential input;

at least one selectable capacitor of a capacitor array coupled to each input of the line driver differential input; and logic for selecting, during an operational state (non-idle state), the at least one selectable capacitor coupled to each input of the line driver differential input to set a specified slew rate.

17. The Tx line driver of claim 16 wherein the logic selects the at least one capacitor to correspond with a specified data rate.

18. The Tx line driver of claim 17 wherein the logic generates at least one bias signal to bias at least one capacitor configured MOSFET into an operational mode.

19. The Tx line driver of claim 17 wherein the at least one capacitor is coupled in series with a switch that provides a connection to a current mirror responsive to receiving a bias signal.

20. The Tx line driver of claim 18 wherein the logic generates at least two bias signals to select at least two capacitors wherein each of two inputs of the differential input is coupled to a selectable capacitor.

21. The Tx line driver of claim 18 wherein the logic generates at least four bias signals to select at least four capacitors wherein each of two inputs of the differential input is coupled to a pair of selectable capacitors.

22. A programmable Tx line driver, comprising:
a pre-driver module for producing an input data stream, the pre-driver circuit coupled to a supply;
a differential line driver module further including a pair of devices coupled to receive the input data stream at a line driver differential input;
means for adjusting a slew rate; and
logic means for selecting the slew rate.

23. The programmable TX line driver of claim 22 wherein the means for adjusting the slew rate comprises a plurality of selectable capacitors.

24. The programmable Tx line driver of claim 22 wherein the means for adjusting the slew rate comprises a plurality of selectable capacitor configured MOSFETs.

25. The programmable Tx line driver of claim 22 further including means for producing a common idle mode state.

26. The programmable Tx line driver of claim 25 wherein the means for producing the common idle mode state further includes switching means for removing a bias signal to the pre-driver module to prompt the pre-driver module to produce an output approximately equal to a source voltage.

27. A method for producing a common mode idle state and for adjusting a slew rate for a data stream in a Tx line driver, comprising:
determining whether the TX line driver is in one of an idle state or in an operational state;
if the Tx line driver is in an idle state, producing an idle state mode signal to a switch and removing a bias signal from a pre-driver module and producing a common mode idle state output from the Tx line driver; and
if the Tx line driver is in an operational state, producing a slew rate selection signal to a capacitor bank to select at least one capacitor of a plurality of capacitors within the capacitor bank to couple the at least one capacitor between a TX line driver input and ground, wherein the selected at least one capacitor establishes a slew rate for the Tx line driver.

28. The method of claim 27 wherein the step of selecting at least one capacitor further includes selecting at least one capacitor for each of two inputs of a pair of differential inputs of the Tx line driver.

29. The method of claim 27 wherein the step of selecting at least one capacitor further includes selecting at least two capacitors for each of two inputs of a pair of differential inputs of the Tx line driver.

* * * * *